July 27, 1965 J. F. BELL 3,196,523

METHOD OF CONSTRUCTING A TUNING STRIP

Original Filed June 30, 1958

INVENTOR.
John F. Bell
BY
Francis W. Crotty
Atty.

3,196,523

METHOD OF CONSTRUCTING A TUNING STRIP

John F. Bell, Wilmette, Ill., assignor to Zenith Radio Corporation, Chicago, Ill., a corporation of Delaware Original application June 30, 1958, Ser. No. 745,414, now Patent No. 3,083,339, dated Mar. 26, 1963. Divided and this application June 6, 1962, Ser. No. 200,568
3 Claims. (Cl. 29—155.5)

Figure 1:
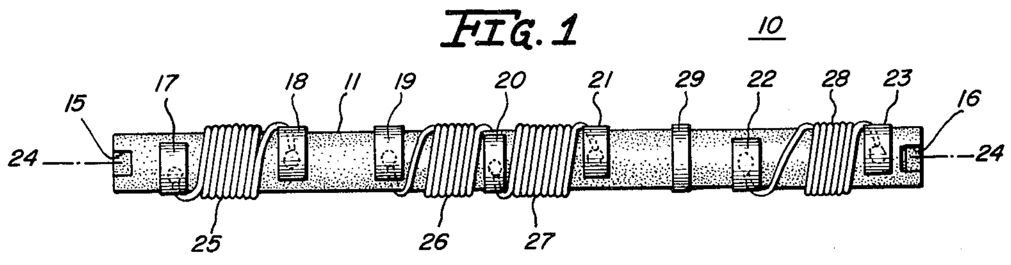

This invention relates in general to tuning strips for television tuning mechanisms and is particularly directed to a method of constructing tuning strips for selecting and translating television signals in a turret type tuning device. This application is a division of the copending application of John F. Bell, Serial No. 745,414, filed June 30, 1959, now Patent No. 3,083,339 for Turret Tuner and assigned to the same assignee as the present invention.

The turret tuner has been widely accepted for use in television receivers because of its inherent flexibility in comparison to other type tuning mechanisms. Briefly, a turret tuner is comprised of a rotatable carriage upon which a plurality of tuning strips are demountably secured. Each strip supports frequency-selective circuit components tuned to an assigned television channel. This construction renders the circuit components of the individual strips completely independent of the circuit components associated with the other strips. Furthermore, this individualized construction permits a more attractive signal-to-noise figure to be realized since the input circuit components on each strip are tailored to provide the most advantageous signal-to-noise figure for its assigned channel.

Although most present-day television tuners are primarily designed for receiving transmission from VHF stations, the flexibility of a turret mechanism is further evidence by the fact that with a tuner of this type reception of transmissions in the UHF band may be accomplished with equal facility. It is only necessary to install on the turret a strip which has been pretuned to the desired UHF channel. One form of UHF strip for a turret tuner is described and claimed in Patent No. 2,596,117 issued to J. F. Bell et al. on May 13, 1952 and assigned to the same assignee as the present invention.

Current trends in television receivers are definitely toward compactness and have been facilitated by miniaturization of circuit components as well as improvements in receiver tubes, e.g., the short-necked picture tube. It is highly desirable to extend this trend to the tuner art to reduce the space requirements of turret tuners while maintaining their excellent performance. A substantial portion of the cost of a turret tuner as well as its size is attributable to the individual tuning strips. These strips, as formerly constructed, comprise a panel of insulating material bearing a number of terminals and a coil form, upon which a plurality of frequency determining self-tuned or tunable inductance coils are positioned. The use of such a supporting panel in addition to the coil form makes it difficult to reduce the size of the strip materially. Moreover, this construction is more costly than desired in that it requires several independent fabricating steps such as winding the coils on the coil form and securing them thereto, assembling the coil on the panel, securing the terminals in place on the panel, and electrically connecting the coils to particular ones of the terminals. In view of the number of components as well as the numerous assembly operations entailed in fabricating these steps, it is obvious that the advantages of prior art turret tuners are not realized inexpensively.

It is therefore an object of the invention to provide an improved method for constructing a tuning strip which avoids the multiple, time consuming and costly operations of present strip manufacturing practices.

It is another object of the invention to provide a method of making a tuning strip characterized by a fewer number of component parts and requiring fewer assembly operations than prior devices.

It is a further object of the invention to provide a method of tuning strip construction which readily lends itself to automation techniques.

The invention contemplates a method of constructing a tuning strip which entails affixing a series of terminals to a core member of insulating material at spaced points along the core and winding a continuous conductor along the core in a single uninterrupted pass therealong to form a multiplicity of conductor turns. An electrical as well as a mechanical connection is established between each terminal and an adjacent portion of the conductor. The conductor between selected ones of the terminals is severed, without severing the core member, and discarded so that the remaining conductor turns are arranged in a plurality of multi-turn inductance coils.

Figure 2:
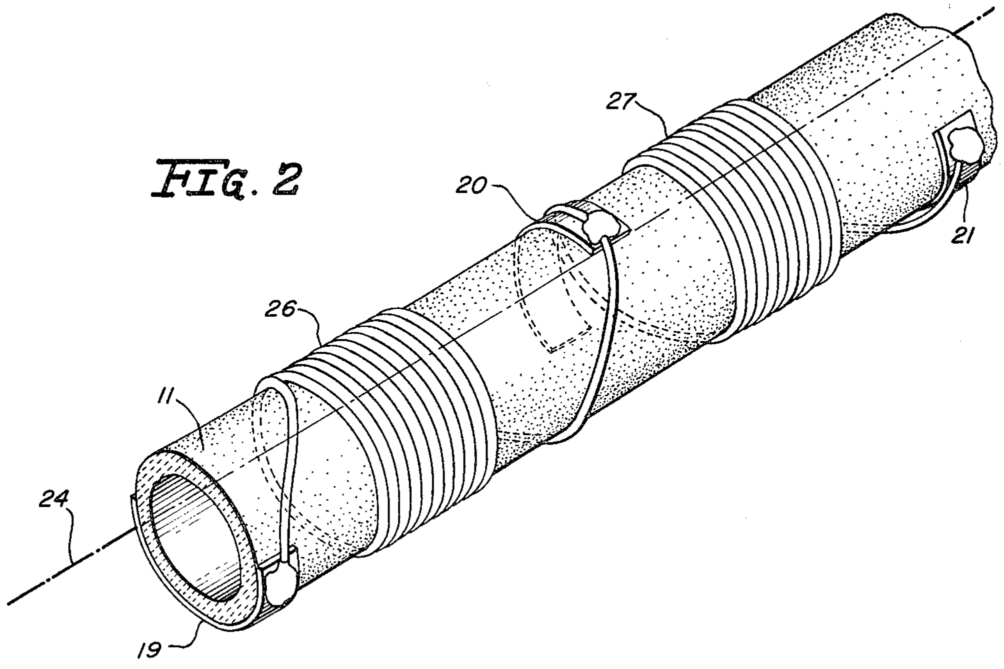

The features of the present invention which are believed to be novel are set forth with particularly in the appended claims. The organization and manner of operation of the invention, together with further objects and advantages thereof, may best be understood by reference to the following description taken in connection with the accompanying drawing, in the several figures of which like reference numerals identify like elements, and in which:

FIGURE 1 is a plan view of a VHF tuning strip constructed in accordance with the invention; and FIGURE 2 is a fragmentary bottom view, in perspective, of the VHF tuning strip of FIGURE 1.

The VHF tuning trip 10 shown in FIGURE 1 comprises a tubular or hollow core member 11 of insulating material such as steatite. The opposed extremities of core 11 include an indexing notch 15 and a clearance notch 16, respectively for indexing and mounting strip 10 in a television tuner of the type disclosed in Patent 3,083,339.

The invention broadly contemplates a method of constructing a multiplicity of conductive turns disposed upon core 11 with a plurality of terminals 17–23 mechanically securing the turns to the core at a plurality of points spaced along the core. The terminals effect an electrical connection with the turns at each such point to constitute a plurality of multi-turn coils 25–28 provided with terminal connectors. The functions of coils 25–28 when in operative relation with a television tuner are fully discussed in the aforesaid Bell patent.

Terminals 17–23 comprise arcuate segments of a conductive coating, such as silver, affixed to core 11 by firing or other suitable bonding process. The segments for any one coil are positioned upon core 11 in an overlapping but peripherally offset spaced relation and are oriented with respect to one another so that they present contact surfaces which are aligned along the axis 24—24 which bisects indexing notch 15. Further, a ground contact comprising a ring 29 of conductive material is disposed upon core 11 between coils 27, 28.

Although the conductor turns disposed upon tuning strip 10 are shown as a plurality of individual coils 25–28, the invention contemplates fabricating such coils from a continuous conductor coated with an insulating material such as polyurethane. More specifically, in constructing the strip the series of terminal segments 17–23 are first affixed to core 11 at spaced points along its length. The conductor is then made fast at one end of the core and is thereafter wound upon core 11 in a single pass therealong to form a multiplicity of conductor turns. The coil turns may be uniformly spaced along the core but it is preferred that they be arranged in a plurality of spaced groups interposed between the terminal segments with a pedetermined number of turns in each group and with the end turns of each of the groups overlaying adjacent ones of the terminal segments to be secured thereto. This arrangement of conductor turns along a core, preparatory to the formation of multi-turn coils, may be accomplished by cam-controlled winding mandrels in a manner well understood in the art. Thereafter, solder is applied to the end turns of each coil overlaying the terminal segment to dispel the insulating varnish and to concurrently effect both an electrical and mechanical connection between each of the end turns and its associated terminal. Thus, the plurality of multi-turn coils 25–28, properly terminated and mechanically secured in position on the form, are completed. At this juncture the several coils are series connected since they were formed of a single, continuous conductor. The excess portions of conductor interconnecting the several coils are now severed and discarded. When it is desired that a pair of coils formed upon core 11 have a mutual inductive coupling, they may be positioned close together as shown for coils 26–27 and they may share a common terminal strip, such as strip 20. This effects an obvious economy.

Although the described method contemplates that the terminals will be previously affixed to the core, it is equally within the scope of the invention to wind a continuous conductor first upon the core member in a single pass therealong to form a multiplicity of conductor turns and thereafter affix the series of terminals to the core to, in effect, arrange the conductor turns in a plurality of groups with the leading and trailing turns of each group electrically and mechanically secured to adjacent ones of the terminals. Furthermore, it is recognized that the multiplicity of conductor turns can be formed upon the core member by printed circuit techniques.

Terminal segments 17, 18 of coil 25 are oppositely oriented relative to the winding direction than terminal segments 19–20 of coil 26, that is, terminal segment 19 viewed from the left end of core 11 progresses in a counterclockwise direction from its free end to its junction with coil 26 and that is the same direction in which the coil is wound. However, with respect to segment 17 the direction from the free end to the coil is in a clockwise direction. At the same time, the direction of segment 20 from its connection with the coil to its free end is counterclockwise whereas the direction of segment 18 is clockwise. The orientation of one pair of terminals with respect to any other pair is arbitrary. It is only necessary that the terminals for an individual coil be peripherally offset upon the core and have those end portions remote from its solder connection with the coil in overlapping relation.

FIGURE 2 shows coils 26, 27 in perspective and clearly illustrates how the invention utilizes the technique of winding a tuning strip from a continuous conductor to provide a plurality of individual coils. FIGURE 2 further illustrates that in addition to providing mechanical security and an electrical connection, each pair of segments comprises an integral portion of its coil. For example, segment 19 constitutes the leading portion of the first turn of coil 26 while segment 20 constitutes the trailing portion of the last turn of coil 26. Segment 20 simultaneously comprises the leading portion of the first turn of coil 27 and segment 21 forms the trailing portion of the last turn of coil 27. The peripheral offset of the two terminal strips of each coil is apparent as is the fact that they have overlapping portions presenting sections aligned along axis 24—24.

In a specific application, coils 25–28 are wound to exhibit an inductance such that when the coils are electrically connected to associated tuner circuitry, the completed circuits effect selection of the channel, either VFH or UHF, to which the strip is assigned.

The subject invention thus teaches novel methods for constructing a tuning strip having a plurality of multi-turn coils formed upon a core of insulating material by a single winding operation from a continuous conductor. As noted the inventive methods are applicable in the fabrication of UHF tuning strips as well as VHF strips.

While particular methods of practicing the invention have been described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. The method of constructing a tuning strip comprising the following steps:
   affixing a series of terminals to a core member of insulating material at spaced points along said core;
   winding a continuous conductor upon said core member in a single uninterrupted pass therealong to form a multiplicity of conductor turns;
   establishing both an electrical and a mechanical connection between each said terminal and an adjacent portion of said conductor;
   severing said conductor without severing said core member between selected ones of said terminals to arrange said remaining conductor turns in a plurality of multi-turn inductance coils;
   and discarding said severed pieces of said conductor.

2. The method of constructing a tuning strip comprising the following steps:
   affixing a series of terminals to a core member of insulating material at spaced points along said core;
   winding a continuous conductor upon said core member in a single uninterrupted pass therealong to form a plurality of spaced groups of turns with each said group being interposed between an assigned pair of said terminals;
   establishing combined electrical and mechanical connections between the end turns of each said group and the respective terminals assigned to said group;
   severing said conductor without severing said core member between selected ones of said terminals to arrange said groups of turns in a corresponding plurality of multi-turn inductance coils;
   and discarding said severed pieces of said conductor.

3. The method of constructing a tuning strip comprising the following steps:
   bonding a series of segments of conductive material to a core member of insulating material at spaced points along said core;
   winding a continuous conductor upon said core member in a single uninterrupted pass therealong to form a multiplicity of conductor turns;
   establishing both an electrical and a mechanical connection between each said segment and an adjacent portion of said conductor;
   severing said conductor without severing said core member between selected ones of said segments to arrange said remaining conductor turns in a plurality of multi-turn inductance coils;
   and discarding said severed pieces of said conductor.

(References on following page)

References Cited by the Examiner

UNITED STATES PATENTS

| | | | |
|---|---|---|---|
| 1,445,919 | 2/34 | Stone | 338—302 |
| 1,796,199 | 3/31 | Gill | 338—323 |
| 1,904,487 | 4/33 | Lyon et al. | 29—155.62 |
| 1,932,923 | 10/33 | Bullinger | 338—323 |
| 2,008,288 | 7/35 | Malone | 338—302 |
| 2,054,424 | 9/36 | Johnson | 338—302 |
| 2,247,869 | 7/41 | Beers | 338—302 |
| 2,319,413 | 5/43 | Leathers et al. | 242—9 |
| 2,351,604 | 1/44 | Ferrill | 336—192 |
| 2,426,522 | 8/47 | Porter | 242—9 |
| 2,468,144 | 4/49 | Van Allen | 29—155.62 |
| 2,959,369 | 11/60 | Kuba et al. | 242—9 |

WHITMORE A. WILTZ, *Primary Examiner.*

JOHN F. CAMPBELL, *Examiner.*

Disclaimer 3,196,523.—*John F. Bell*, Wilmette, Ill. METHOD OF CONSTRUCTING A TUNING STRIP. Patent dated July 27, 1965. Disclaimer filed Oct. 19, 1966, by the assignee, *Zenith Radio Corporation*; the inventor assenting.

Hereby enter this disclaimer as to claims 1 and 2 of said patent.

[*Official Gazette January 17, 1967.*]